United States Patent [19]
Schiavini

[11] Patent Number: 5,483,420
[45] Date of Patent: Jan. 9, 1996

[54] LOCKING AND HEAT-EXCHANGE DEVICE FOR MODULAR PRINTED CIRCUIT BOARD HOLDER STRUCTURE

[75] Inventor: Jean-Pierre Schiavini, Montigny-Le-Bretonneux, France

[73] Assignee: Sextant Avionique, Meudon La Foret, France

[21] Appl. No.: 285,143

[22] Filed: Aug. 3, 1994

[30] Foreign Application Priority Data

Sep. 10, 1993 [FR] France .................................. 93 10898

[51] Int. Cl.⁶ .................................................. H05K 7/20
[52] U.S. Cl. .......................... 361/707; 211/41; 361/719; 361/801
[58] Field of Search .................. 361/736, 752, 361/796, 801, 802, 689, 704, 707, 715, 717–719, 720, 722; 165/80.3, 185; 174/16.3; 211/41; 24/304, 524–526; 254/104; 403/374, 409.1; 439/62, 64, 68, 73, 197, 267, 485

[56] References Cited

U.S. PATENT DOCUMENTS

| | | |
|---|---|---|
| 3,586,102 | 6/1971 | Gilles . |
| 4,298,903 | 11/1981 | Ellis ......................................... 361/704 |
| 4,318,157 | 3/1982 | Rank et al. . |
| 4,354,770 | 10/1982 | Block . |
| 4,414,605 | 11/1983 | Chino ....................................... 361/707 |
| 4,480,287 | 10/1984 | Jensen ...................................... 361/707 |
| 4,819,713 | 4/1989 | Weisman .................................... 165/1 |
| 4,953,059 | 8/1990 | McNulty .................................. 361/720 |
| 5,036,428 | 7/1991 | Brownhill ................................ 361/721 |

FOREIGN PATENT DOCUMENTS 2713850  6/1978  Germany ................................ 361/801

Primary Examiner—Gerald P. Tolin
Attorney, Agent, or Firm—Browdy and Neimark

[57] ABSTRACT

The device embodying the invention comprises a rigid and good heat conducting frame supporting a printed circuit board, and comprising two posts having two runners susceptible of slidably fitting into two opposite U-shaped slide rails, each runner having two symmetrical ramps on which are applied, due to the action of tightening means generating a relative transversal motion of the wedges, the respective bevelled sides of two mobile wedging blocks, in a direction perpendicular to the plane of the frame. This device is particularly suited to the fastening of printed circuit boards into electronic installations on board aircraft.

6 Claims, 3 Drawing Sheets

LOCKING AND HEAT-EXCHANGE DEVICE FOR MODULAR PRINTED CIRCUIT BOARD HOLDER STRUCTURE

BACKGROUND OF THE INVENTION

1. Field of the Invention

This invention relates to a locking device serving e.g. to fasten printed circuits into the rack of an electronic installation.

It applies notably, though not exclusively, to the electronic installations taken on board space missiles or aircraft.

2. Description of the Prior Art

Generally, it is known that structures of this type currently in use come in the form of cases in which printed circuit boards are fitted by sliding. The entire rear side of these cases supports mechanical and electric connecting elements suited to those of the printed circuit boards.

Experience has proved that this solution is unsuited to the electronic equipment taken on board aircraft where shock and extreme vibratory conditions prevail.

In fact, when a printed circuit board inside such a rack has been subjected to intense vibrations for a certain period of time, the board's connectors and the weld seams ensuring the mechanical and electric contacts between the board and its electronic components tend to deteriorate.

Under these circumstances, it is thus necessary to fix these printed circuit boards without play and in a way that they cannot be deformed when submitted to vibrations. Furthermore, it is necessary that these cards be easily locked in place and unlocked in order to facilitate their maintenance.

Moreover, the available space on board aircraft is usually very limited. The printed circuit boards of onboard electronic equipment are therefore grouped together in a very small space. It ensues that the heat emitted by the electronic components borne by these boards is not easy to evacuate.

The known structures are not very satisfactory from this point of view, as they are ill-suited to the heat exchanges required to evacuate the heat thus emitted.

It is therefore necessary to provide an efficient means of evacuating this heat in the racks destined to equip aircraft.

OBJECT OF THE INVENTION

The main object of this invention is to solve these problems. For this purpose, there is provided a fastening device for printed circuit boards, acting simultaneously as heat exchanger with a rack in which the boards are fitted and connected.

SUMMARY OF THE INVENTION

This device is characterized in that it comprises, for each board to be fastened:

- a rigid and good heat conducting frame supporting the printed circuit board, comprising two opposite posts susceptible of slidably fitting into two respective U-shaped slide rails, in good heat conducting material, and integral with the rack;
- a means of putting the posts into thermal contact with the heat-generating electronic components borne by the board;
- a means of locking the frame into the slide rails, which ensures application of a lateral side of the posts against a corresponding wing of the slide rails so as to obtain maximum heat exchange between the posts and the slide rails.

By way of these arrangements, the printed circuit boards are rigidified by the frames which are firmly held in the slide rails. This does away with the mechanical stresses brought to bear on the connectors connecting the boards to the rack and their components, when the latter are subjected to intense vibrations.

Furthermore, to efficiently evacuate the heat emitted by the electronic components borne by the board, the slide rails need only be brought into contact with heat dissipators e.g. integrated into the underframe of the rack.

According to a feature of the invention, the locking means comprises:

- two runners formed respectively in the posts of the frame, susceptible of fitting slidably into the slide rails, each having two ramps that are symmetrical in relation to a plane perpendicular to the posts;
- two mobile wedging blocks per post, each having a bevelled side coming to rest against the two respective ramps of the post's runner, with a longitudinal motion of the wedging blocks in relation to the runner generating a relative transversal motion of the wedging blocks in a direction perpendicular to the plane of the frame; and
- a tightening means susceptible of displacing the wedging blocks towards one another longitudinally in relation to the runner.

Thus, each of the two posts of the frame can be firmly fastened to one of the two wings of a U-shaped slide rail, the blocking force exerted on the frame being a function of the locking strength of the two wedging blocks against each runner. This arrangement ensures good thermal conduction between the frame and the slide rails of the rack.

Advantageously, the locking means comprises, for each post, a cap screw of which the threaded rod passes freely and successively through a first of the two wedging blocks and through the runner, to screw into the second wedging block.

In order to avoid the wedging blocks falling to the bottom of the rack when dismounting the frame from the rack and the ensuing risk of causing deterioration, the frame forms, in the axis of each fastening screw, a first stop intended to retain the second wedging block, and a second stop retaining the screw and in which a through bore is made to enable the passage of a tightening tool susceptible of cooperating with the head of the screw.

In this way, when wishing to loosen the fastening screws in order to remove a frame, the second stop prevents the screw from being removed from the frame. As for the first stop, it enables avoidance of complete withdrawal of the screw from the second wedging block.

The risk of losing parts when dismounting a frame is thus suppressed, and storage of the frame facilitated.

BRIEF DESCRIPTION OF THE DRAWINGS

Further features and advantages of the invention will be apparent from an embodiment of the invention described hereinunder, by way of a non-limiting example, in reference to the corresponding accompanying drawings in which.

DESCRIPTION OF THE PREFERRED EMBODIMENTS

Figure 1:
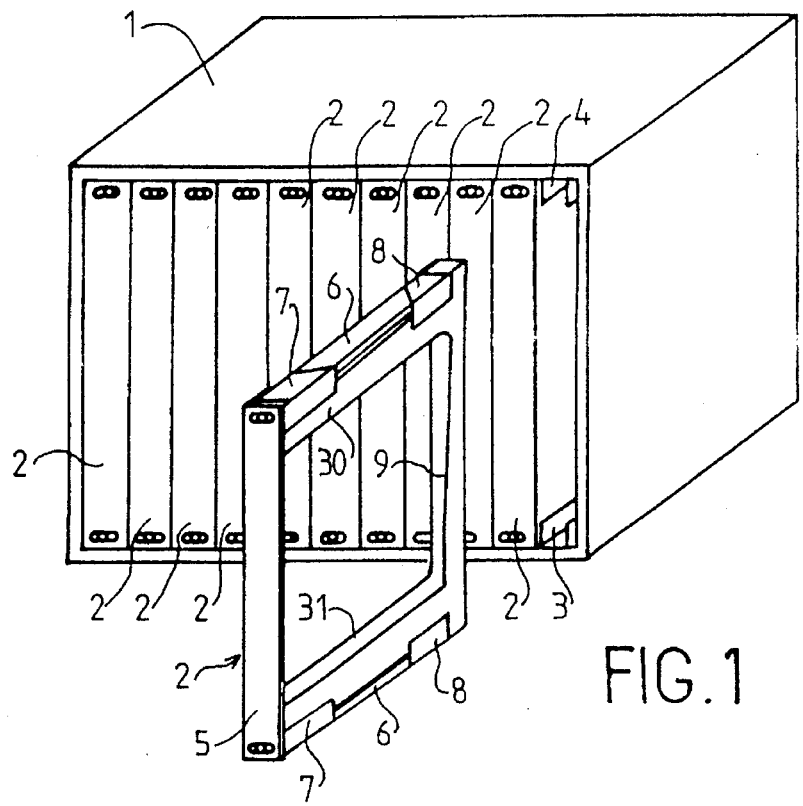
FIG. 1 shows a perspective view of a rack of an electronic installation, taken on board an aircraft, in which are inserted frames to which printed circuit boards are fastened.

FIG. 1 represents a rack 1 of an electronic installation grouping together a plurality of frames 2 bearing printed circuit boards. Each rectangular-shaped frame 2 comprises two parallel posts 30, 31 and two parallel crosspieces 9 with one of the crosspieces supporting a removable extraction face 5.

The two posts 30, 31 respectively have two identical runners 6 which extend over the greater part of their respective two outer opposite sides. These two runners 6, each associated with two corner-positioned wedging blocks 7, 8, are intended to respectively fit by sliding into two U-shaped slide rails 3, 4, and are situated opposite one another and respectively on the upper and lower inner sides of the latter. These slide rails 3, 4 are of a good heat conducting material and are integral with the underframe of the rack 1 in order to enable good thermal exchange between the frames and the underframe.

Figure 2:
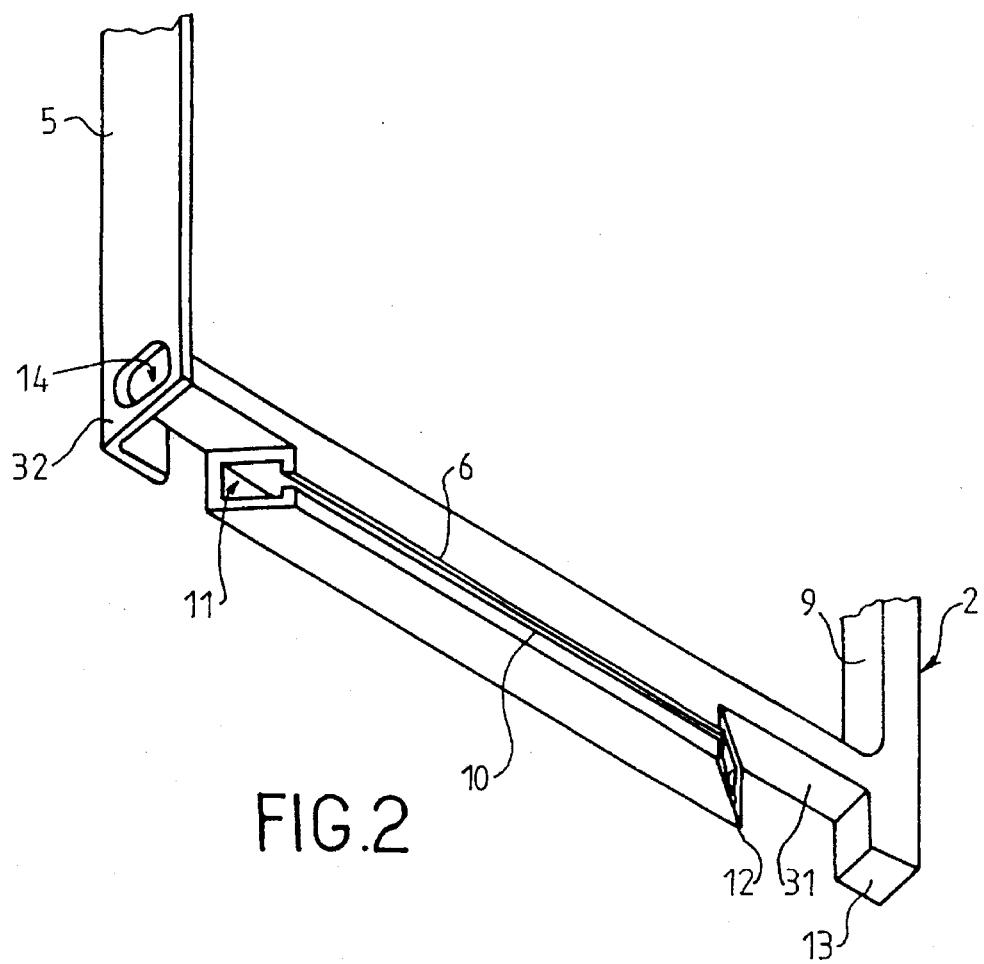
FIG. 2 shows a perspective view of a runner fitting a frame such as represented in FIG. 1.

As represented in FIG. 2, the runner 6 of the post 31 has a rectangular cross section and two rectangular ramps 11, 12 of same dimensions that are symmetrical in relation to a plane perpendicular to the axis of the runner 6 and are respectively formed in its two opposite ends.

The crosspiece 9 and the extraction face 5 extend beyond the ends of the posts 30, 31 to form, on each side of the frame 2, two stops 13, 32 situated opposite the ramps 11, 12 of each runner 6.

Furthermore, the runner 6 has a channel of rectangular cross section running right through it to form an opening in each of the two ramps 11, 12. This channel has a slot 10 extending over the entire length of the smaller rectangular longitudinal side of the runner 6, thus enabling the two openings of the channel situated on the ramps 11, 12 to communicate.

Figure 3:
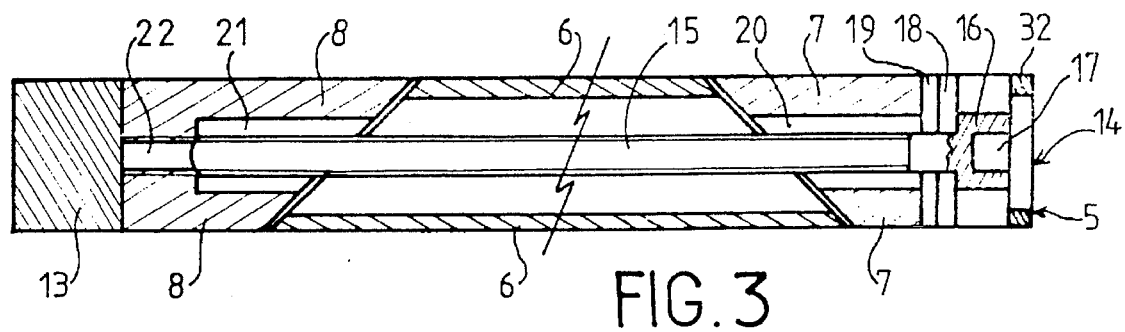
FIGS. 3 and 3a respectively show a longitudinal sectional drawing and a side-face view of the locking device embodying the invention in the unlocked position.
Figure 3A:
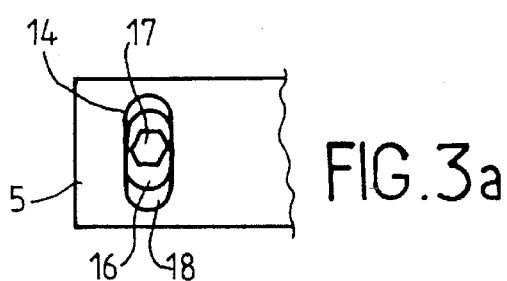

In FIGS. 3 and 3a, the locking device comprises a threaded screw 15 fitted with a head 16 of which the shape is designed so as to cooperate with a conventional tightening tool. To this end, the head of the screw can have e.g. a six-sided hexagonal cavity 17.

The locking device further comprises the two corner-positioned wedging blocks 7, 8 of rectangular cross section and each having a bevelled side of slope corresponding to that of the ramps 11, 12 of the runner 6. Each of these two wedging blocks 7, 8 has a through bore 20, 21 which notably runs through its bevelled side. The bore 20 of the first wedging block 7 has a diameter larger than that of the rod of the screw 15, whereas the bore 21 of the second wedging block 8 is partially tapped so that the screw 15 can fit, without being screwed, into this bore 21 over a certain length before screwing into the tapped part 22.

In addition, in this device, the screw 15 successively passes through a flat washer 18, a friction washer 19, the first wedging block 7, the runner 6 and the second wedging block 8, the bevelled sides of the wedging blocks 7, 8 being respectively placed opposite the ramps 11, 12 of the runner 6. In order to mount the device, the removable extraction face 5 must, of course, be dismounted, if only to enable insertion of the screw 15.

In the unlocked position (FIGS. 3 and 3a), the screw 15 is only fitted into the untapped part of the bore 21 of the second wedging block 8. It can thus be displaced both axially, between the stop 32 and the entry to the tapped bore 22, and transversely, between the inner sides of the channel of the runner 6. During these displacements, the screw 15 remains fitted into the wedging block 8 which is thus maintained between the runner 6 and the stop 13.

The stops 13 and 32 thus confer upon the locking device the advantage of being captive.

Furthermore, the stop 32 is fitted with an oblong-shaped bore 14 coaxial with the runner 6 so that, irrespective of the position of the screw 15, the head 16 is always accessible to a suitable tightening tool.

Figure 4:
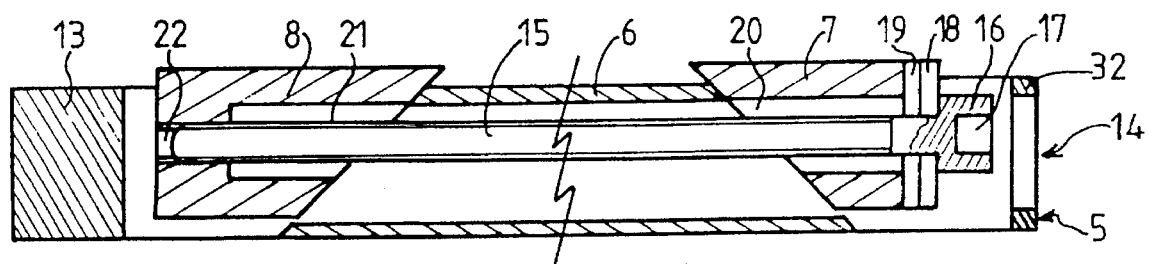
FIGS. 4 and 4a show the same views of the device embodying the invention in the locked position.
Figure 4A:
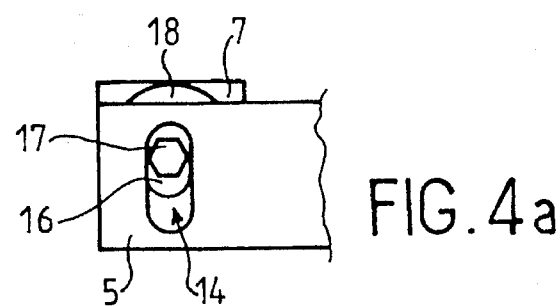

In the locked position (FIGS. 4, 4a and 5), the screw 15 is fitted into the tapped bore 22 of the second wedging block 8. By comparison with the unlocked position, the two wedging blocks 7, 8 have come closer to one another, and the assembly comprising the screw 15, the washers 18, 19 and the wedging blocks 7, 8 has been displaced transversely in relation to the runner 6, by way of the sliding of the bevelled sides of the wedging blocks 7, 8 on the ramps 11, 12 of the runner 6.

Thus, in order to insert and lock a frame 2 inside the rack 1, it need only be completely inserted by sliding into the case 1 between two U-shaped slide rails 3, 4 facing one another. Since the two locking devices associated with the two runners 6 of the frame 2 are in the unlocked position, they can easily slide on the slide rails 3, 4.

Locking of the frame 2 can then be performed by means of an appropriate tool to be inserted through the bores 14 in order to tighten the two screws 15 associated with the two locking devices. By way of the presence of the two ramps 11, 12 and the particular shape of the wedging blocks 7, 8, the tightening force of the screw 15 is transmitted to the wedging blocks 7, 8 which, in turn, exert pressure on one 37 of the two wings 36, 37 of each of the two slide rails 3, 4, while the larger longitudinal rectangular side of the runner 6 comes to bear on the other wing 36.

It can be remarked that the blocking force of the frame 2 is a function of the tightening force of the screws 15.

Figure 5:
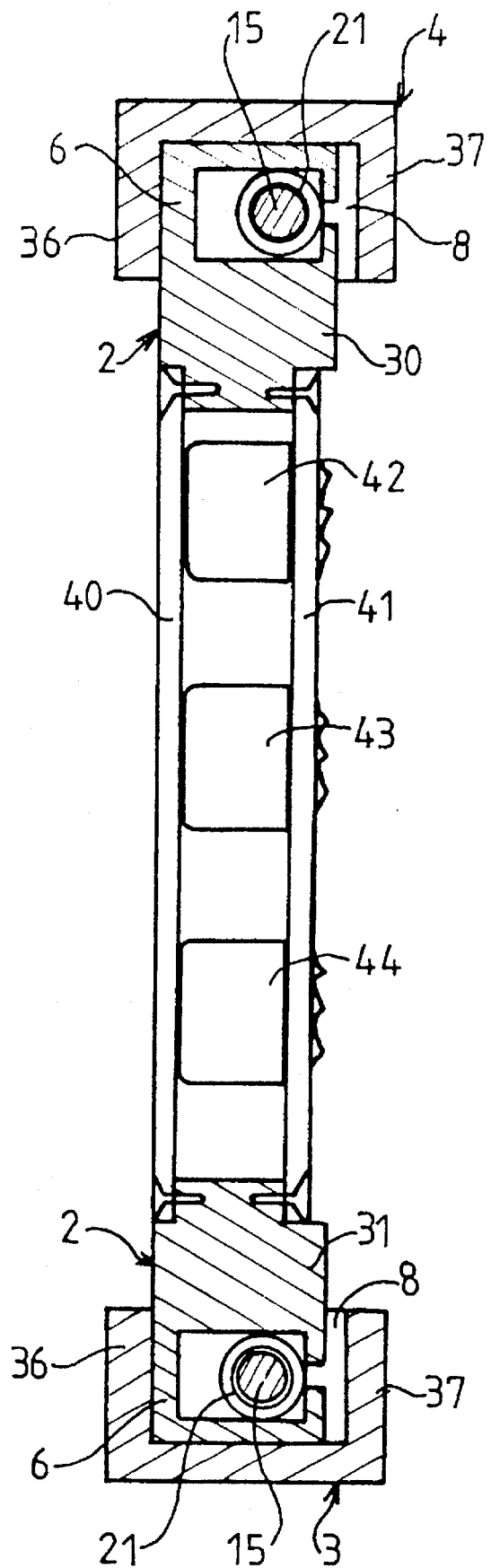
FIG. 5 shows a transversal sectional drawing of a frame bearing a printed circuit board mounted between two slide rails of the rack.

In FIG. 5, the inner edges of the frame 2 have rabbets which enable, on one side, the fixing, e.g. by means of screws, of the printed circuit board 41 bearing heat-emitting electronic components 42, 43, 44 in order to completely house the board and the components within the interior volume delimited by the frame 2.

On the other side of the frame, a plate 40 of a good heat conducting material acting as a lid, is put into thermal contact with the components 42, 43, 44. This plate can also be fastened by screws, in the free rabbets of the frame 2.

These arrangements enable good heat exchange to be obtained between the electronic components 42, 43, 44 situated on the printed circuit board 41 and the underframe of the rack 1. In fact, the heat emitted by these components is captured by the plate 40 which transmits it directly to the posts 30, 31. Due to the quality of the locking of the frame 2 into the slide rails 3, 4 and to the fact that a large portion of the posts 30, 31 is in thermal contact with one 36 of the wings 36, 37 of the slide rails 3, 4, the heat received by the posts 30, 31 is efficiently transmitted to the underframe of the rack 1 via the slide rails 3, 4. By equipping the underframe with heat dissipators, this heat can be easily evacuated.

I claim:

1. A device fastening a printed circuit board, acting simultaneously as heat exchanger with a rack in which said board is fitted and connected, said device comprising:

a rigid and good heat conducting frame having a high thermal capacity and comprising two parallel posts linked together by two crosspieces perpendicular to said posts, said frame supporting said printed circuit board and delimiting an internal volume which completely houses electronic components borne by said board, said volume being closed on one side by said board and on an opposite side by a plate of a good heat conducting material put into direct contact with said electronic components, said posts being respectively slidably fitted into two opposite and good heat conductive slide rails integral with said rack and facing each other, each slide rail having a U-shaped cross section formed by said rack and two parallel wings, the distance between said wings corresponding substantially to the thickness of said posts and the distance between said posts corresponding substantially to the distance between two opposite slide rails;

means securing said posts into said slide rails, said securing means for providing a pressure contact of a lateral side of each of said posts against a corresponding wing of said slide rails so as to obtain maximum heat exchange between said posts and said slide rails.

2. The device as claimed in claim 1, wherein said securing means comprises:

two runners formed respectively in said posts of said frame, fitting slidably into said slide rails, each having two ramps that are symmetrical in relation to a plane perpendicular to said posts;

two mobile wedging blocks per post, each having a bevelled side coming to rest against said two respective ramps of said post's runner, with a longitudinal motion of said wedging blocks in relation to said runner generating a relative transversal motion of said wedging blocks in a direction perpendicular to said plane of said frame; and a tightening means susceptible of displacing said wedging blocks towards one another longitudinally in relation to said runner.

3. The device as claimed in claim 2, wherein said tightening means comprises, per post, a cap screw of which the threaded rod passes freely and successively through a first of said two wedging blocks and through said runner, to screw into said second wedging block.

4. The device as claimed in claim 3, wherein said frame forms, in the axis of each fastening screw, a first stop intended to retain said second wedging block, and a second stop intended to retain said screw, said second stop having a through bore enabling the passage of a tightening tool susceptible of cooperating with said head of said screw.

5. The device as claimed in claim 1, wherein said frame has inner edges forming rabbets which enable, on one side, to fix said printed circuit board so that said board is completely housed, along with the components it bears, within the interior volume delimited by said frame, and, on the other side, a plate of a good heat conducting material put into direct contact with said components.

6. A device fastening a printed circuit board, acting simultaneously as heat exchanger with a rack in which said board is fitted and connected, said device comprising:

a rigid and good heat conducting frame having a high thermal capacity and comprising two parallel posts linked together by two crosspieces perpendicular to said posts, said frame supporting said printed circuit board and delimiting an internal volume which completely houses electronic components borne by said board, said volume being closed on one side by said board and on an opposite side by a plate of a good heat conducting material put into direct contact with said electronic components;

two runners respectively formed in said posts and fitting slidably into two opposite and good heat conductive slide rails integral with said rack and facing each other, each slide rail having a U-shaped cross section formed by said rack and two parallel wings, each runner having two ramps that are symmetrical in relation to a plane perpendicular to said posts, said runners having a thickness substantially equal to the distance between the wings of said slide rails;

two mobile wedging blocks per runner, each having a bevelled side coming to rest against said two respective ramps of said runner, with a longitudinal motion of said wedging blocks in relation to said runner generating a relative transversal motion of said wedging blocks in a direction perpendicular to the plane of said frame; and a cap screw per runner having a threaded rod which passes freely and successively through a first of said two wedging blocks and through said runner, to screw into said second wedging block, said screw while being screwed displacing said wedging blocks towards one another longitudinally in relation to said runner thus providing said transversal motion of said wedging blocks and a pressure contact of a lateral side of said runner against a corresponding wing of said slide rail so as to obtain maximum heat exchange between said posts and said slide rails;

a first and a second stop per screw intended to retain said screw and said wedging blocks when the screw is completely unscrewed from the second wedging block, said stops being formed in said frame in the axis of said screw in a vicinity of the ends thereof, said second stops having a through bore enabling the passage of a tightening tool susceptible of cooperating with the head of said screw.

* * * * *

UNITED STATES PATENT AND TRADEMARK OFFICE
CERTIFICATE OF CORRECTION

PATENT NO. : 5,483,420

DATED : January 9, 1996

INVENTOR(S) : Schiavini et al.

It is certified that error appears in the above-indentified patent and that said Letters Patent is hereby corrected as shown below:

Title page, Item [75] (inventor), add the second inventor
--Alain Cognard, Antony, France--.

Signed and Sealed this

Fourth Day of June, 1996

Attest:

BRUCE LEHMAN

Attesting Officer        Commissioner of Patents and Trademarks